(12) United States Patent
Dhong et al.

(10) Patent No.: US 6,915,506 B2
(45) Date of Patent: Jul. 5, 2005

(54) METHOD AND APPARATUS FOR EVALUATING RESULTS OF MULTIPLE SOFTWARE TOOLS

(75) Inventors: Sang Hoo Dhong, Austin, TX (US); Sam Dinkin, Austin, TX (US); Harm Peter Hofstee, Austin, TX (US); Stephen Douglas Posluszny, Round Rock, TX (US)

(73) Assignee: International Business Machines Corporation, Armonk, NY (US)

(*) Notice: Subject to any disclaimer, the term of this patent is extended or adjusted under 35 U.S.C. 154(b) by 671 days.

(21) Appl. No.: 09/817,138

(22) Filed: Mar. 27, 2001

(65) Prior Publication Data

US 2002/0143590 A1 Oct. 3, 2002

(51) Int. Cl.⁷ .................................................. G06F 9/44
(52) U.S. Cl. ........................ 717/101; 717/121; 717/125
(58) Field of Search ................................. 717/100–103, 717/120–121, 124–127, 131, 164

(56) References Cited

U.S. PATENT DOCUMENTS

| 4,967,368 A | * | 10/1990 | Bolling et al. ................. 706/52 |
| 5,911,074 A | * | 6/1999 | Leprince et al. ............ 717/100 |
| 5,987,181 A | * | 11/1999 | Makiyama et al. ......... 382/239 |
| 6,128,608 A | * | 10/2000 | Barnhill ....................... 706/16 |
| 6,584,467 B1 | * | 6/2003 | Haught et al. ................ 707/10 |

* cited by examiner

*Primary Examiner*—Ted T. Vo
(74) *Attorney, Agent, or Firm*—Stephen C. Kaufman, Esq.; McGinn & Gibb, PLLC

(57) ABSTRACT

A method and structure for optimizing a solution for a complex problem typically solved by software tools includes selectively converting problem data into a format appropriate for one or more preselected vendor's set of solution tools and inputting the formatted design data into the one or more preselected vendor's set of solution tools. If more than one vendor has been preselected, resultant solution results are compared and the optimum solution is selected.

26 Claims, 3 Drawing Sheets

METHOD AND APPARATUS FOR EVALUATING RESULTS OF MULTIPLE SOFTWARE TOOLS

BACKGROUND OF THE INVENTION

1. Field of the Invention

The present invention generally relates to a method and apparatus for improving the design or analysis solution for complicated problems solved by alternative software tool packages.

2. Description of the Related Art

In a design or analysis problem for a complicated problem such as a VLSI (Very Large-Scale Integration) circuit, a designer (e.g., in a generic problem, a decision maker) would preferably apply two or more design or analysis tools and then select the preferred solution. However, a problem with this conventional approach is that typically the decision maker or designer does not have easy access to all of the alternative software tool packages that provide a solution. Nor is it particularly desirable for a decision maker or designer to personally exercise multiple design or analysis tools since this would require obtaining and maintaining these tools, training all operators for all of these tools, and paying for multiple tools.

A specific example is the problem of synthesizing a VLSI hardware description (such as GL1) from a high level description of the artifact such as VHDL (VHSIC Hardware Description Language) or Verilog. Multiple tools from multiple vendors are available to solve this problem. Yet, for the reasons mentioned above, the selection of the "best" solution in the current state of the art is limited to the generation and selection of the preferred solution within a single vendor tool, because a designer does not usually have access to multiple vendors' repertoire of tools. Additionally, because of budgetary constraints, a designer may not even have access to all of the most appropriate tools within a single vendor's repertoire.

Although not intended as a total listing, other examples of complex problems in which multiple software tool packages might be used to provide a solution are:

creating a schedule of classes in a high school;

creating a distribution schedule of goods; and, creating a structure for a design of a building.

In all of the above examples, a user would typically have a software tool to exercise the problem and, without the benefit of the present invention, would be left with a single solution based on a single specific software tool or vendor's set of tools. Hence, the solution would not be optimized and would not take advantage of the infrastructure of multiple tools.

SUMMARY OF THE INVENTION

In view of the foregoing and other problems, it is, therefore, an object of the present invention to provide a structure and method for providing access for decision makers to various available tools and selecting the preferred solution automatically.

It is another object of the invention to provide value to the decision maker by providing access to the best available solution amongst a plurality of available solutions from different tools and/or vendors.

It is another object of the invention to provide a system where a decision maker submits a problem or design data (preferably via the Internet) to a single vendor who, for a fee prepares a solution and returns the solution to the circuit designer, based upon having utilized all appropriate tools within the vendor's repertoire of design, analysis, and layout tools.

It is another object of the invention to provide a system where a decision maker submits his problem or design data (preferably via the Internet) to a single provider of services who, for a fee prepares a solution and returns the solution to the circuit designer, based upon having utilized all appropriate tools within multiple vendors' repertoires of design, analysis, and layout tools.

In a first aspect of the present invention, a method for optimizing a solution for a complex problem solvable by a plurality of software tool packages is described in which problem data is selectively converted into a format appropriate for at least one preselected vendor's set of software tools, the formatted problem data is inputted into at least one preselected vendor's set of software tools, and, if more than one vendor has been preselected, the results (the resultant solutions) are compared and an optimum solution is selected based on a criteria provided in the problem data.

In a second aspect of the present invention, a system for determining an optimized solution to a problem solvable by software tools is described in which there is a means for converting the problem description into a format suitable for a software tool package for a plurality of predetermined vendors, each software tool package including at least one software tool, a means for exercising the problem data on the plurality of vendors' software tool packages, and a means for ranking results of the plurality of vendors' software tool packages.

In a third aspect of the present invention, a system for determining an optimal solution to a problem solvable by software tools is described which includes a first computer terminal permitting an originator to enter data describing the problem to be solved, the data including a criteria for verification and comparison, and to transmit the problem data to at least one other computer, and at least one second computer capable of receiving the problem data from the first computer, where the at least one second computer contains at least one software tool package for exercising the problem data, and the at least one second computer additionally capable of transmitting a result of exercising the problem data to either the first computer or to a predesignated third computer.

In a fourth aspect of the present invention, a system for optimizing the solution of a complex problem solvable by software tool packages includes an interface permitting an operator at a first computer to enter a problem description, the problem description including a verification criteria and a comparison criteria, an interface to permit the operator to transmit the problem description from the first computer to a second computer, an interface permitting the second computer to receive the transmitted problem description, a software tool using the verification criteria to verify a solution of the problem description, a software tool using the comparison criteria to determine a ranking of any solutions of the problem description, and an interface to transmit said ranking back to the first computer.

In a fifth aspect of the present invention, a computer readable medium contains instructions executable by a computer for an interface permitting an operator at a first computer to enter a problem description, the problem description including a verification criteria and a comparison criteria, an interface to permit the operator to transmit the problem description from a first computer to a second computer, an interface permitting the second computer to receive the transmitted problem description, a software tool using the verification criteria to verify a solution of the problem description, a software tool using the comparison criteria to determine a ranking of any solutions of the problem description, and an interface to transmit the ranking back to the first computer.

In a sixth aspect of the present invention, a computer readable medium contains instructions executable by a computer for a selective convertion of a problem data into a format appropriate for at least one preselected vendor's set of software tools, an inputting of the formatted problem data into at least one preselected vendor's set of software tools, and, if more than one vendor has been preselected, a comparison of results of resultant solutions and a selection of an optimum solution based on a criteria provided in the problem data.

With the unique and unobvious aspects of the invention, a better solution is obtained to complex problems solved by software tools by analyzing the solutions from multiple solution providers. Using the invention a decision maker has access to solutions based on multiple vendors'software packages. This access and improvement in result are not currently available.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

To explain the invention in concrete form, the following discussion will first focus on one possible example in which the invention can be applied, that of VLSI design. It is noted that additional possible non-limiting applications are described above. That is, having read the following description, a person of ordinary skill in the art will readily understand the concept and could easily tailor and apply the invention to other specific examples.

Figure 1:
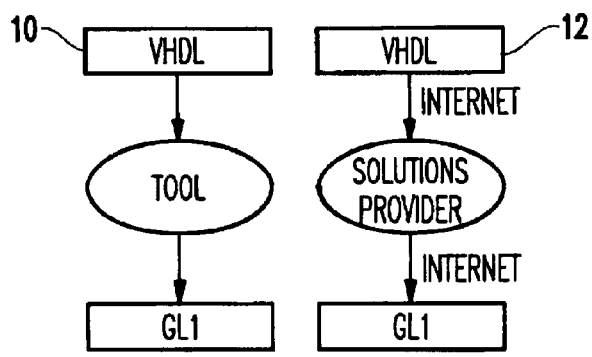
FIG. 1 is a diagram representing conventional solutions to a specific example of the type of software-tool applications that would benefit from the invention, that of providing access to VLSI design tools.
Figure 2:
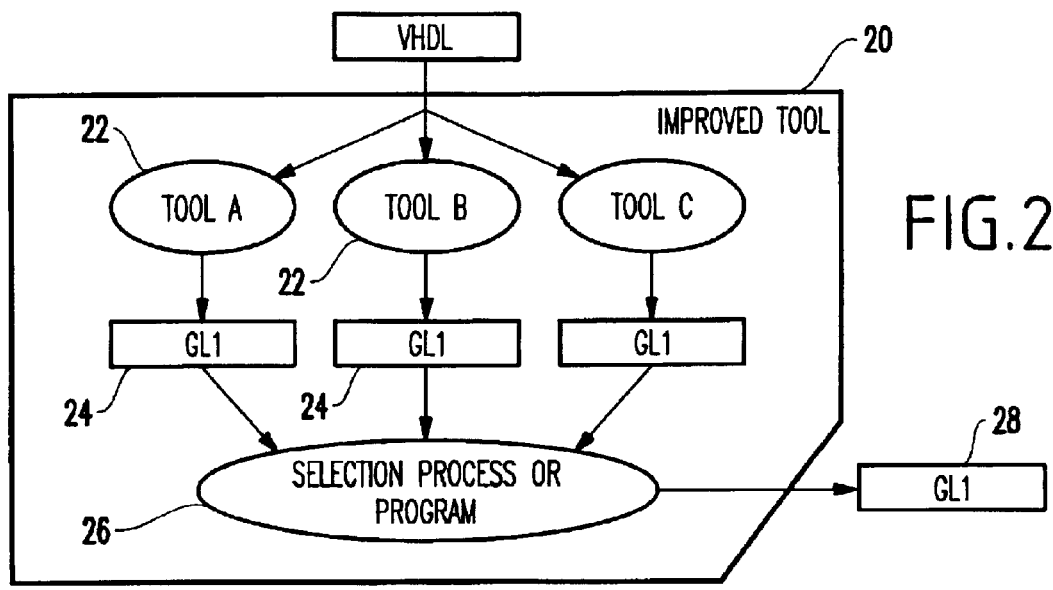
FIG. 2 is a flow diagram illustrating a first exemplary embodiment of the invention, using the VLSI specific example.

Referring now to the drawings, and more particularly to FIG. 1, the problem of synthesizing a VLSI hardware description (such as GL1) from a high level (such as VHDL or Verilog) description of the circuit is illustrated by reference numeral 10 as involving one or more design tools. This process may be done in-house by the designer or may be subcontracted to be performed outside the designer's company by a solutions provider 12, perhaps using an intranet or the Internet as a communications link, An exemplary method of the invention to improve the final design solution is illustrated by reference numeral 20 in FIG. 2. A plurality of suppliers' tools 22, each of which provides a solution 24, receives the VHDL description of the problem. Typical vendors providing tools would be, for example, Synopsys, Inc., Cadence Design Systems, Inc., Mentor Graphics, Inc., and Cascade Design Automation, Inc. From these solutions 24, selection process 26 determines which is optimal and provides result 28 as an output ultimately returned to the circuit designer. The optimal solution is determined by a set of parameters provided by the circuit designer along with possibly a set of relative weights for these parameters. Parameters a circuit designer might consider important and would provide to the solutions provider along with the VHDL description might include, for example: chip area, chip power, number of mask layers and/or number of process steps required to manufacture the chip, anticipated manufacturing yield, and chip speed or frequency. In addition to permitting a ranking of the design solutions, this listing of parameters may also serve to verify that each vendor solution provides acceptable solutions for the listing of parameters. Therefore, the circuit designer might also include a range of values that she considers acceptable. VLSI tool packages typically have measurement capability for numerous parameters so that this verification exercise would be obvious to one of ordinary skill in the art. Finally, selection process 26 may include verification tools such as tools that verify functional equivalence of the GL1 and VHDL and tools that conduct design rule checking (DRC) on the GL1.

As an example of the ranking process, suppose vendor A software tool package provides a solution having $area_A$, $power_A$, $no\_layers_A$, $yield_A$, and $frequency_A$ and vendor B tool package provides $area_B$, $power_B$, $no\_layers_B$, $yield_B$, and $frequency_B$. The circuit designer has indicated a weighting of parameters: area 10%, power 50%, no_layers 10%, yield 20%, and frequency 10%. A number of formulas could be used to rank the design results according to these criteria. One example would be the following. The solution from vendor B ranks above the solution from vendor A if $$f(area_A/area_B) \times 0.1 + f(power_A/power_B) \times 0.5 + f(no\_layers_A/no\_layers_B) \times 0.1 + f(yield_B/yield_A) \times 0.2 + f(frequency_B/frequency_A) \times 0.1 > 0,$$

where $f(x)=x$ if $x \geq 1$ and $f(x)=-1/x$ if $0<x<1$.

Figure 3:
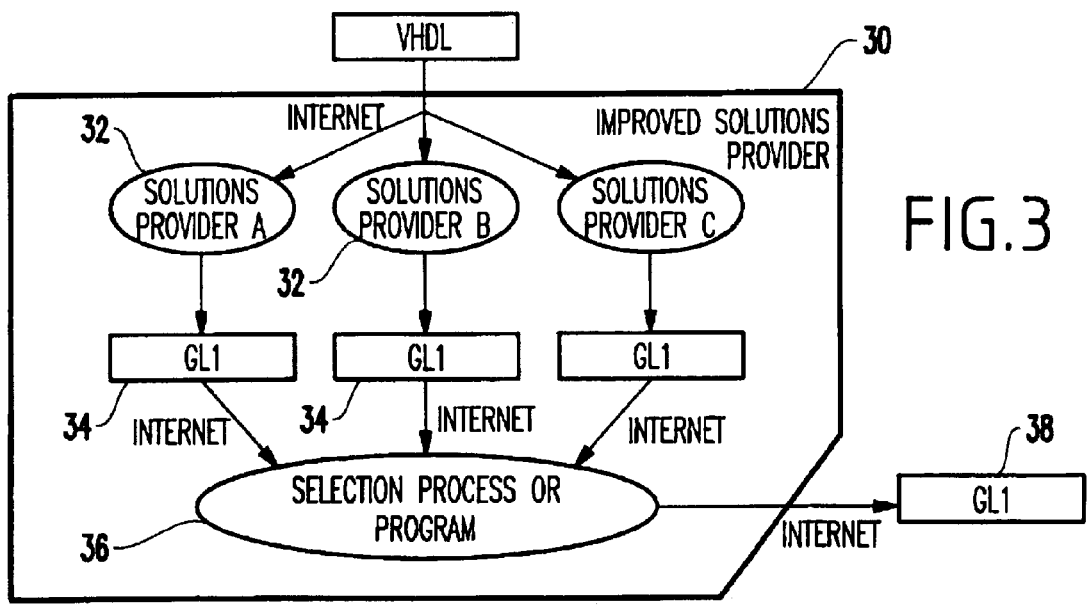
FIG. 3 is a flow diagram illustrating a second exemplary embodiment of the invention, using the VLSI specific example.

A second exemplary method 30 is shown in FIG. 3. A plurality of solutions providers 32 each provide their solution 34. Preferably these solutions providers 32 receive the VHDL circuit description via the Internet and provide specific solution 34 via the Internet to a common program 36 providing an analysis to determine which solution 34 is optimal. Optimal solution 38 is output to the circuit designer, preferably via Internet.

The present invention is preferred because a better solution is obtained by analyzing the solutions from multiple solution providers. In the case of the example (GL1 from VHDL), selecting the preferred solution requires evaluating multiple solutions against the same metrics (such as cost and performance) which is preferably done again using multiple analysis programs.

Figure 4:
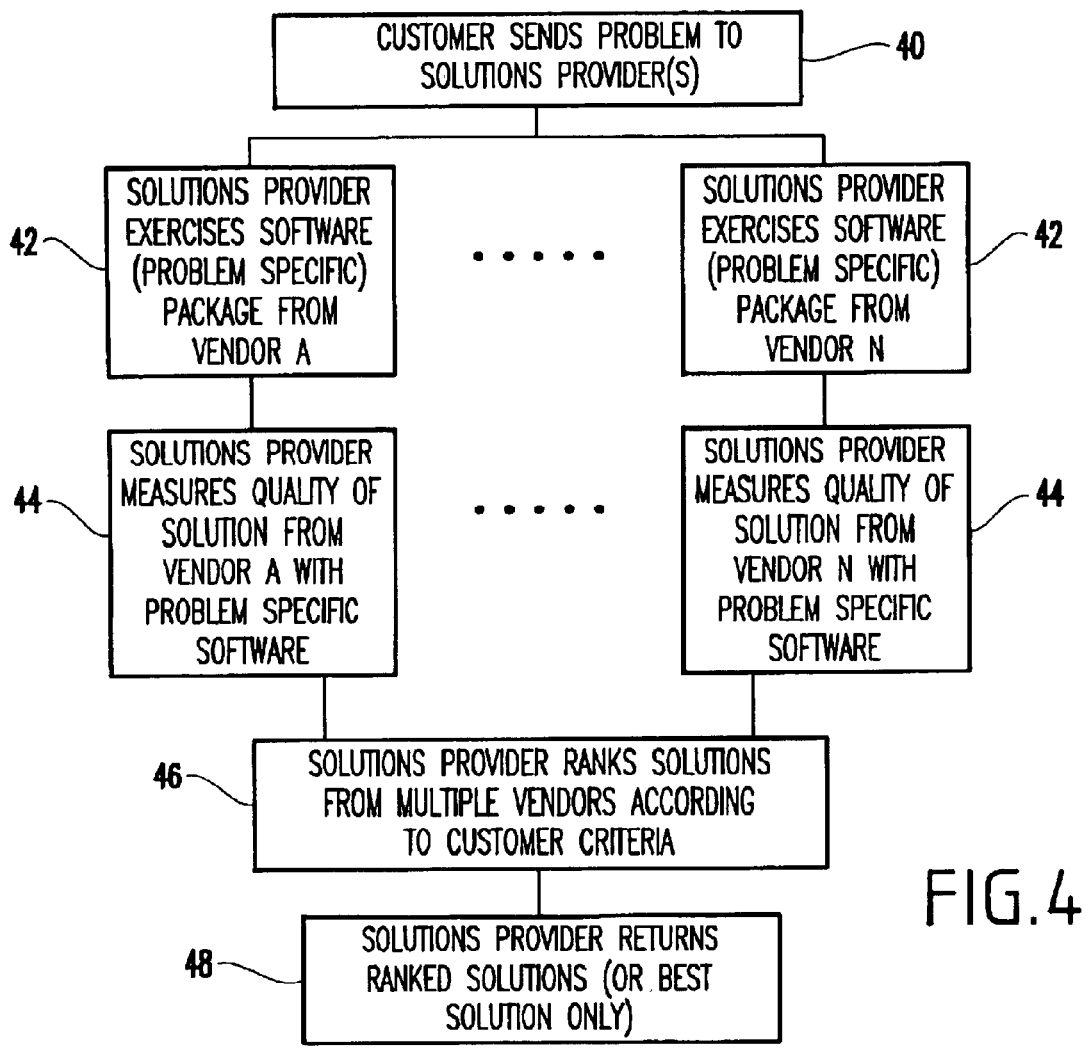
FIG. 4 is a flow diagram illustrating the generic application of an exemplary embodiment of the invention.

FIG. 4 shows an exemplary embodiment of the invention as applied to a generic application. The decision maker sends a statement of the problem to be solved to a solution provider who will exercise up to N vendors' software tool packages (40). The specific format for this input problem statement from the decision maker might depend upon the tools used by each specific vendor's tool package. However, the problem statement conversion would more likely be done by the solutions provider as a preliminary process in exercising the respective vendor's tool package (42).

Having exercised the vendor's software package, the solutions provider then measures the quality of the solution from that vendor's package (44), ranks the various measures (46), and returns the ranked solutions to the decision maker (48). As above for the VLSI example, the ranking may be based on a listing of parameters provided by the decision maker as part of the problem description. Parameters that might be used for ranking the solutions for the problem of creating a schedule of classes in a high school might include: number of classrooms, number of students that cannot have preferred set of classes, number of teachers that cannot teach preferred grades, and number of hours the school must be open. The parameters that might be used for ranking solutions for the creation of a distribution schedule of goods might be: number of drivers, number of trucks, and longest route. In the example of creating a structure for a building design, parameters might include: number of different parts needed, number of worker hours for assembly, and total cost of parts.

Figure 5:
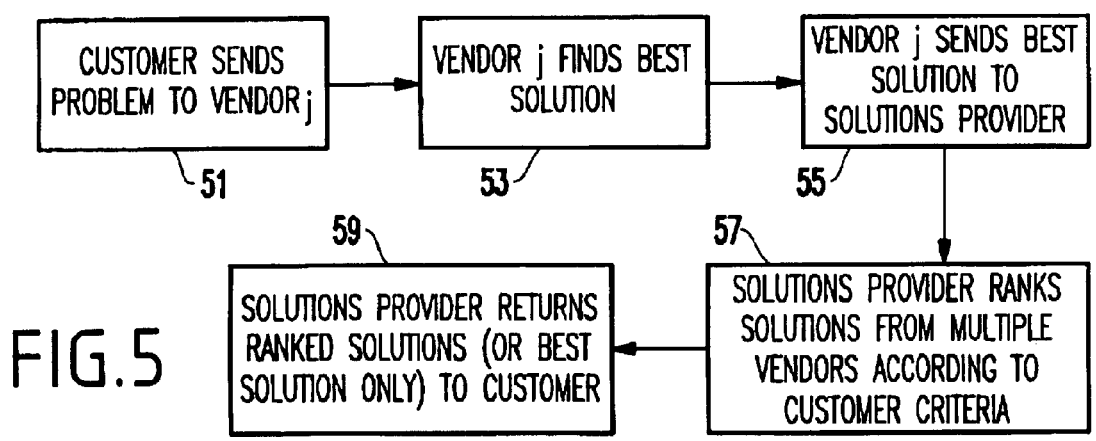
FIG. 5 is a flow diagram illustrating the generic application of a second exemplary embodiment of the invention.

FIG. 5 illustrates another embodiment of the generic process of the invention. In this embodiment, the decision maker sends the problem description along with evaluation criteria to a number of vendors (51), perhaps via the Internet. Each vendor j finds a best solution using their tool package (53) and sends that vendor solution to a designated solutions provider (55). The designated solutions provider ranks the vendor solutions (57) using the same design evaluation criteria originally provided by the decision maker and returns the ranked solutions to the decision maker (59).

Figure 6:
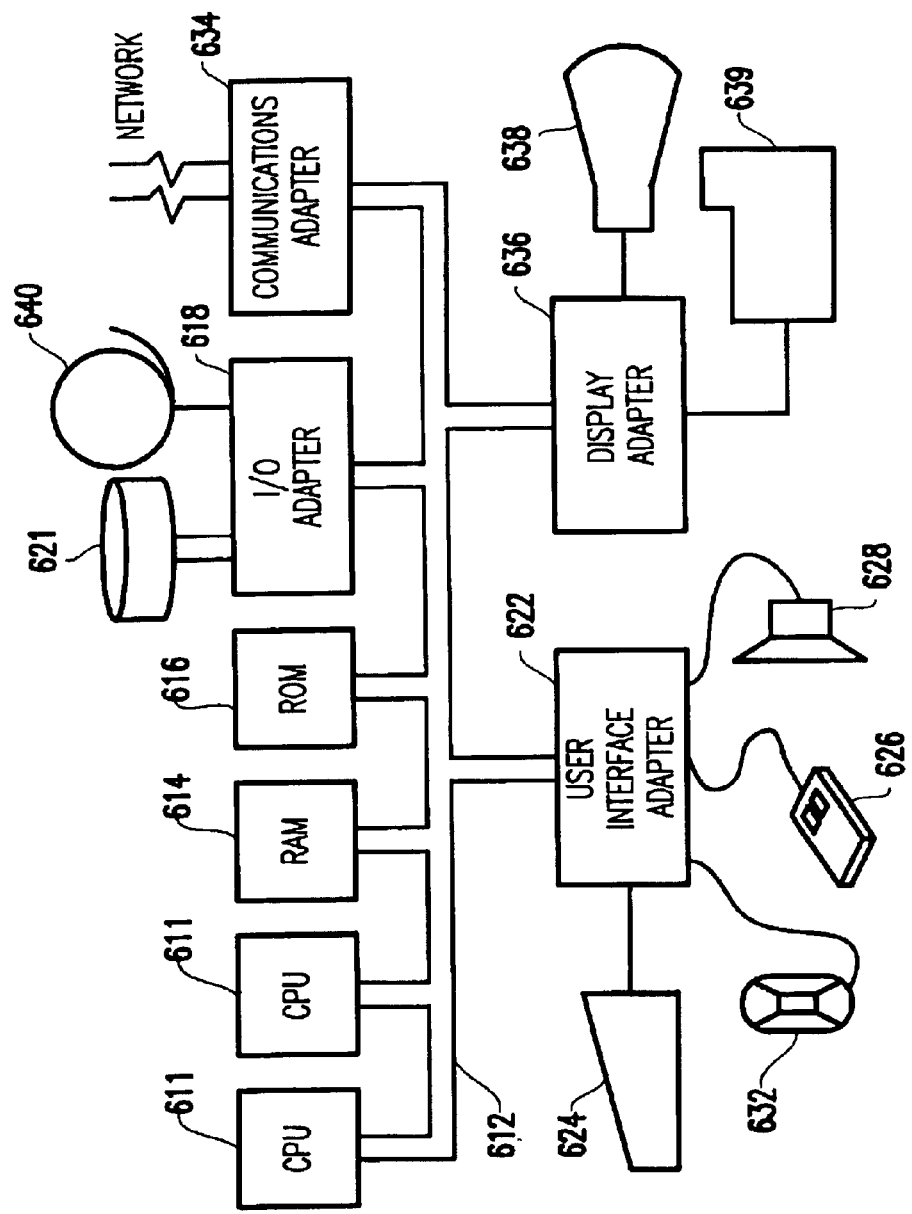

FIG. 6 illustrates a typical hardware configuration of an information handling/computer system for use with the invention and which preferably has at least one processor or central processing unit (CPU) 611.

The CPUs 611 are interconnected via a system bus 612 to a random access memory (RAM) 614, read-only memory (ROM) 616, input/output (I/O) adapter 618 (for connecting peripheral devices such as disk units 621 and tape drives 640 to the bus 612), user interface adapter 622 (for connecting a keyboard 624, mouse 626, speaker 628, microphone 632, and/or other user interface device to the bus 612), a communication adapter 634 for connecting an information handling system to a data processing network, the Internet, an Intranet, a personal area network (PAN), etc., and a display adapter 636 for connecting the bus 612 to a display device 638 and/or printer 639 (e.g., a digital printer or the like).

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, comprising signal-bearing media tangibly embodying a program of machine-readable instructions executable by a digital data processor incorporating the CPU 611 and hardware above, to perform the method of the invention.

Figure 7:
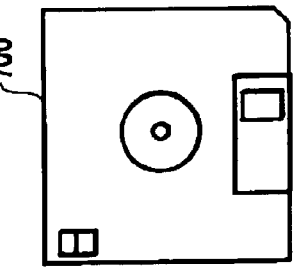
FIGS. 6 and 7 illustrate an exemplary hardware implementation of the invention.

This signal-bearing media may include, for example, a RAM contained within the CPU 611, as represented by the fast-access storage for example. Alternatively, the instructions may be contained in another signal-bearing media, such as a magnetic data storage diskette 700 (FIG. 7), directly or indirectly accessible by the CPU 611.

Whether contained in the diskette 700, the computer/CPU 611, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, compiled from a language such as "C", etc.

With the unique and unobvious features of the present invention, a better solution is obtained to complex problems solved by software tools by analyzing the solutions from multiple solution providers. Using the invention a decision maker has access to solutions based on multiple vendors' software packages. This access and improvement in result are not currently available.

While the invention has been described in terms of preferred embodiments, those skilled in the art will recognize that the invention can be practiced with modification within the spirit and scope of the appended claims.

What is claimed is:

1. A method of optimizing a solution for a complex problem solvable by more than one vendor's software tool packages, said method comprising:

inputting a formatted problem data into each of software tools from different tool vendors; and using one or more parameters to determine a comparative ranking of solutions resulting from said different vendors' software tools.

2. The method of claim 1, further comprising receiving said problem data and said one or more ranking parameters from a decision maker.

3. The method of claim 2, wherein said receiving of said problem data and said ranking parameters from said decision maker comprises communicating via a computer network.

4. The method of claim 2, further comprising forwarding a result to said decision maker.

5. The method of claim 4, wherein said result comprises at least one of:

said resultant solutions from one or more of said software tools;

said comparative ranking of said solutions; and an optimum solution, as based on said comparative ranking.

6. The method of claim 4, wherein said forwarding of said result comprises communicating via a computer network.

7. The method of claim 2, wherein said decision maker sends said problem data to a solutions provider, said solutions provider then exercising said problem data on a plurality of different vendors' software tool packages.

8. The method of claim 2, wherein said decision maker sends said problem data to a plurality of vendors, each said vendor then exercising said problem data in said vendor's software tool package.

9. The method of claim 8, wherein each said vendor subsequently forwards said solution to a predesignated solutions provider who determines, based on one or more parameters to determine a comparative ranking, an optimal solution from said plurality of vendors' solutions.

10. The method of claim 1, wherein said complex problem comprises an electronic chip design.

11. A system for determining an optimized solution to a problem solvable by software tools from different tool vendors, said system comprising:
   means for exercising a problem description on a plurality of software tools from said different tool vendors; and
   means for ranking results obtained from said plurality of software tools.

12. The system of claim 11, further comprising means for entering, by an originator, description data describing said problem to be solved, including criteria for at least one of a verification of results and a comparison ranking of said results.

13. The system of claim 12, further comprising means for returning at least one result to said originator.

14. The system of claim 13, wherein said at least one result comprises at least one of the following:
   a solution of at least one of said at least one software package;
   said ranking results; and
   an optimium solution based on said ranking of said results.

15. The system of claim 12, wherein said originator enters said description data via a computer network.

16. The system of claim 13, wherein said means for returning said at least one result comprises a computer network for communicating with said originator.

17. The system of claim 12, wherein said originator sends said description data to a solutions provider, said solutions provider thereinafter exercising said problem on said plurality of software tools.

18. The system of claim 12, wherein said originator sends said description data to a plurality of vendors, each said vendor thereinafter exercising said problem on said vendor's software tool package.

19. The system of claim 18, wherein each said vendor subsequently forwards said solution to a predesignated solutions provider who determines, based on said criteria for comparison, at least one of a comparative ranking and an optimal solution from said plurality of vendors' solutions.

20. A system for determining an optimal solution to a problem solvable by software tools from different vendors, said system comprising:
   at least one second computer for receiving problem data from a first computer, said first computer permitting an originator to enter said problem data describing a problem to be solved, said problem data including a comparison criterion, said at least one second computer containing a plurality of software tools from different vendors for exercising said problem data, said at least one second computer selectively transmitting a result of said exercising of said problem data to at least one of said first computer and a predesignated third computer.

21. The system of claim 20, further comprising a software tool to verify each said result against a verification criteria included in said problem data.

22. The system of claim 20, further comprising a software tool for ranking said solutions from said plurality of software tools, based on said comparison criteria.

23. A system for optimizing the solution of a complex problem solvable by software tool packages from different vendors, said system comprising:
   a first interface for allowing an operator at a first computer to enter a problem description, said problem description including a a comparison criterion;
   a second interface for allowing said operator to transmit said problem description from said first computer to a second computer;
   a third interface for allowing said second computer to receive said transmitted problem description and exercise said problem on each of a plurality of software tools from different vendors; and
   a ranking software tool that uses said comparison criterion to determine a ranking of solutions of said problem description resulting from said software tools.

24. A system for determining an optimized solution to a problem solvable by software tools from different vendors, said system comprising:
   a converter providing, from a problem description, a format suitable for each of a plurality of software tools;
   an oversight module exercising said problem description on each of said plurality of software tools from said different vendors; and
   a ranker module sorting and ranking results of said plurality of software tools.

25. A computer readable medium containing instructions executable by a computer to find an optimal solution to a problem solvable on software tools from different vendors, said instructions comprising one or more of:
   a first interface for allowing an operator at a first computer to enter a problem description, said problem description including a software tool result comparison criterion;
   a second interface for allowing said operator to transmit said problem description from a first computer to a second computer;
   a third interface for allowing said second computer to receive said transmitted problem description and exercise said problem on one of said vendor's software tool; and
   ranking module using said comparison criterion to determine a ranking of solutions of said problem description as exercised on said different vendors' software tools.

26. A computer readable medium containing instructions executable by a computer to perform a method of optimizing a solution for a complex problem solvable by each of a plurality of software tool packages from different vendors, said instructions comprising:
   an input module for inputting problem data into said at least one preselected vendor's set of software tools so that said problem data can be exercised by said vendor's software tools; and
   a ranking module so that, if more than one vendor has been preselected, for at least one of comparing results of resultant solutions and selecting an optimum solution based on one or more ranking parameters provided in said problem data.

* * * * *